(12) United States Patent
Brozek

(10) Patent No.: US 10,768,222 B1
(45) Date of Patent: Sep. 8, 2020

(54) METHOD AND APPARATUS FOR DIRECT TESTING AND CHARACTERIZATION OF A THREE DIMENSIONAL SEMICONDUCTOR MEMORY STRUCTURE

(71) Applicant: PDF Solutions, Inc., San Jose, CA (US)

(72) Inventor: Tomasz Brozek, Morgan Hill, CA (US)

(73) Assignee: PDF SOLUTIONS, INC., Santa Clara, CA (US)

( * ) Notice: Subject to any disclaimer, the term of this patent is extended or adjusted under 35 U.S.C. 154(b) by 0 days.

(21) Appl. No.: 15/997,411

(22) Filed: Jun. 4, 2018

Related U.S. Application Data

(60) Provisional application No. 62/514,199, filed on Jun. 2, 2017.

(51) Int. Cl.
*G01R 31/28* (2006.01)

(52) U.S. Cl.
CPC ..... *G01R 31/2853* (2013.01); *G01R 31/2884* (2013.01)

(58) Field of Classification Search
CPC .............. G01R 1/0408; G01R 31/2889; G01R 31/2893; G01R 31/2808; G01R 31/2863; G01R 31/2867
USPC ............ 324/762.06, 756.01, 756.02, 756.07
See application file for complete search history.

(56) References Cited

U.S. PATENT DOCUMENTS

| | | | | |
|---|---|---|---|---|
| 6,466,005 B1* | 10/2002 | Yao | .................. | G01R 17/08 324/117 R |
| 7,812,418 B2* | 10/2010 | Hsu | .................. | H04R 19/005 257/414 |
| 2008/0079437 A1* | 4/2008 | Robarge | .............. | G01R 15/146 324/522 |
| 2014/0125369 A1* | 5/2014 | Erickson | ............. | G01R 31/307 324/754.22 |
| 2014/0203827 A1* | 7/2014 | Thangaraju | ....... | H01L 21/76898 324/713 |
| 2015/0187680 A1* | 7/2015 | Seo | ..................... | G01R 31/2853 324/762.01 |

OTHER PUBLICATIONS

Crippa, L., et al., "3D Charge Trap NAND Flash Memories," in 3D Flash Memories, ed. R. Micheloni, Springer 2016, pp. 85-127.
(Continued)

*Primary Examiner* — Giovanni Astacio-Oquendo
(74) *Attorney, Agent, or Firm* — Pillsbury Winthrop Shaw Pittman LLP

(57) ABSTRACT

Described here is an apparatus and method of testing a vertical (3D) semiconductor memory structure coupled between word lines and bit lines, by means of a direct connections of a plurality of test pads to word lines and bit lines of the memory structure on memory product wafer. Such connections are created by modified patterns of metal lines through contacts and vias created on the memory product wafer. The described apparatus and method are used for detecting electrical continuity (opens and shorts) in the memory structure, calculating resistance of selected word lines or bit cell strings, or performing more complex tests of memory bit cell transistors. The result of this detection can then be used to find defective regions or memory cells in the semiconductor memory structure. Such a testing device may be referred to as a direct testing system.

20 Claims, 18 Drawing Sheets

(56) References Cited

OTHER PUBLICATIONS

Jang, J., et al., "Vertical Cell Array using TCAT(Terabit Cell Array Transistor) Technology for Ultra High Density NAND Flash Memory," Digest of Technical Papers, Symposium on VLSI Technology, 2009, pp. 192-193.

* cited by examiner

400B

3D NAND memory process stopped just before the 1st interconnect level

Without Metals

400A

Fully Processed 3D NAND memory with Metal Interconnect layers on top of 3D Memory Array

TABLE 1

1800

| No. | Defect | Possible failure mode | Detection with Direct Test |
|---|---|---|---|
| 1 | Particle in the Tier stack deposition | ☐ Incompletely etched Channel Hole(s)<br>☐ Shorted Channel Holes<br>☐ Open WL Contacts<br>☐ Shorted WL Contacts<br>☐ Shorted neighbor WL's within same Tier layer<br>☐ Shorted WL between subsequent Tier layers | ☐ Electrical Open (Continuity) of String(s)<br>☐ Shorts between neighbor Strings<br>☐ Open Word Lines<br>☐ Shorted Word Lines (intra-layer vs. inter-layer separation) |
| 2 | Blocked or incomplete WL separation etch | ☐ Shorted neighbor WL's across multiple Tier layers at the bottom of the stack<br>☐ Open WL (in W RMG integration) | ☐ Word Line shorts<br>☐ Word Line opens |
| 3 | Incompletely removed Dummy Gate Blocked RMG deposition | ☐ Bit Cell string permanently open (cannot turn-ON) | ☐ Word Line Opens<br>☐ Multiple Strings not continuous |
| 4 | Blocked or incompletely filled Poly Pillar | ☐ Channel Hole - Bitcell string Open (impacted continuity) | ☐ Very high String resistance, although all WL's OK |
| 5 | Gate dielectric stack defects | ☐ Gate to- String short (Pillar to WL short) | ☐ Word Line (or multiple Word Lines) shorted to String |
| 6 | Incomplete Contact Etch (Underetch) Contact Overetch | ☐ Open WL Contact<br>☐ Contact connected to two or more Tier layers | ☐ Open Word Line<br>☐ Shorted Word Lines between subsequent WL levels |

FIG. 18

METHOD AND APPARATUS FOR DIRECT TESTING AND CHARACTERIZATION OF A THREE DIMENSIONAL SEMICONDUCTOR MEMORY STRUCTURE

RELATED APPLICATIONS

This application claims priority to the U.S. Provisional Application No. 62/514,199 filed Jun. 2, 2017, which is expressly incorporated herein by reference.

BACKGROUND

This disclosure relates to apparatus and methods of testing and characterizing the electrical integrity of the array and cell properties of semiconductor memories, more specifically 3D or vertical memories. Semiconductor memories ICs are prevalent in the electronics industry today in all kinds of products, consumer as well as industrial. Memories can be broadly categorized into two types, the first is planar (2D) memories and the second is vertical (3D) memories. In 2D memories, all the memory cells are substantially contained on a single plane semiconductor substrate, where as in 3D memories, the memory cells are vertically arranged across multiple layers of semiconductor substrate.

As the consumer electronics products such as cell phones, tablets, laptops become smaller in size, the demand for high density memories increases. That is why in recent times 3D memories have become more popular as those can provide higher densities in smaller sizes compared to their 2D counterparts. In other words, 3D memories allow more memory cells to be contained in a relatively smaller size compared to the 2D memories. Testing and characterization of semiconductor memories is an important phase in the memory process development and manufacturing process. Especially, an early phase testing during technology development can help detect faults in the memory ICs, which can save a considerable amount of money in the long run. Therefore, more and more product manufacturers now demand an early phase testing of memory ICs.

SUMMARY

Described here is an apparatus and method of testing and characterizing a semiconductor memory structure by means of direct coupling or probing a number of memory cells and a plurality of electrically active elements such as word line (WL) planes, select line (SL) walls, channel pillars in the memory structure. The electrically active elements mentioned above may be probed to detect electrical opens and shorts. A large number of memory cells may be sampled at a high sampling rate which may give an overall indication of a good or bad memory structure.

BRIEF DESCRIPTION OF THE DRAWINGS

The above aspects and other aspects and features will become apparent to those ordinarily skilled in the art upon review of the following description of specific embodiments in conjunction with the accompanying figures, wherein:

FIG. 18 illustrates a table which lists example of defects in a 3D memory structure, possible failure modes, and failure mode detection performed by a direct tester in accordance with the teachings of the present disclosure.

DETAILED DESCRIPTION OF THE EMBODIMENTS

Figure 1:
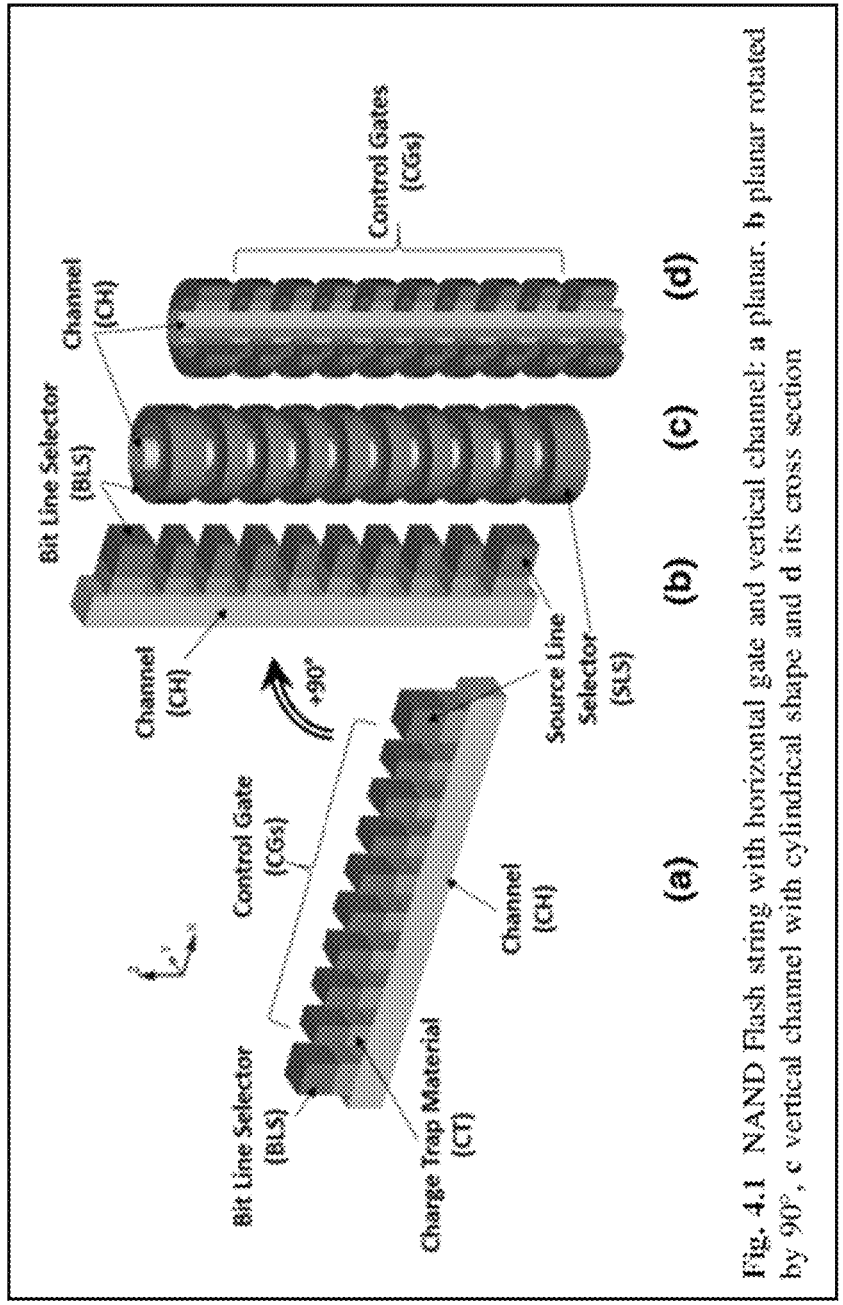
FIG. 1 illustrates a an example 100 of a vertical NAND flash memory cell string with gates, a vertical channel, string select line (SSL), a bit line selector (BLS), and a source line selector (SSL) in planar view, planar rotated by 90 degrees, in cylindrical shape and its cross section.

Embodiments will now be described in detail with reference to the drawings, which are provided as illustrative examples so as to enable those skilled in the art to practice the embodiments.

Notably, the figures and examples below are not meant to limit the scope to a single embodiment, but other embodiments are possible by way of interchange of some or all of the described or illustrated elements. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments.

In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any in the specification or claims to be ascribed an uncommon or special meaning unless explicitly set forth as such. Further, the scope encompasses present and future known equivalents to components referred to herein by way of illustration in the real product design.

In the following specification, the terms semiconductor memories or memory ICs or memory chips may be used alternately. Also the terms memory structure or array may be used alternately. Further the term 3D or vertical may be used alternately. During semiconductor IC manufacturing process, testing of ICs during fabrication is crucial to their reliability as it can allow early failure detection. Early failure detection can be used to correct the deficiencies in the mask or layout at wafer or die level (like extra dummy word lines, or dummy channel holes at the edge of the array), which can help reduce the overall manufacturing iterations, thereby reducing costs and increasing the possibility of design reuse.

For a memory array to perform its functions all the cells should be accessible by combinations of columns and rows (WL's and BL's), which are typically selected by periphery circuitry such as multiplexers and decoders. The memory cells have to be functional and should not ideally have any defects or faults. Moreover, the memory array itself cannot have massive shorts, as those may cause large leakage currents. Nor can the memory array have massive opens, as those may limit the access to the memory cells in the array.

One way by which the ICs can be tested is by performing electrical characterization of the circuit blocks and elements. Typically this is done by sending test vectors to the input pins and reading the resulting vectors on the output pins of the circuit. When it comes to memory ICs, electrical characterization is typically performed on all of the memory cells. Logic values (0's or 1's, or their combinations in case of so-called multi-level cells) are written or programmed into the cells in various patterns and sequences. The values are then read back to check proper responses of memory cells. Some of the cells, or their groups, e.g. along the WL, or a BL may show failures, i.e. not being able to switch to remember the new programmed state—they are classified as bad cells. In case of a vertical 3D memory array, 3D defects may cause failures of clusters of the cells, impacting multiple WL's or multiple BL's, causing massive power supply shorts. In early stage of memory technology development, periphery often fails, making it impossible to test the array, or the array contains too many defects and leakages impacting the test.

Therefore, it would be advantageous to have a characterization device or a tester which can accurately test and characterize each and every circuit element or every single memory cell in a memory IC. It would be even more advantageous to have a direct tester or characterization device for 3D memories.

The embodiments disclosed herein teach apparatuses and methods of characterization of a semiconductor IC by direct testing all critical building blocks of memory array and large population of memory cells within the target product memory array. The semiconductor ICs may comprise any form of electronic circuit elements including transistors, resistors, capacitors, or any other active or passive devices. In one example, such an apparatus may also be referred to as a direct tester. The embodiments of a direct tester may be especially beneficial for testing and characterizing 3D memories, although it can be used to test and characterize any planar memory as well. The direct tester according to the present disclosure provides a direct detection of Opens and Shorts caused by particles and defects in a 3D memory array such as that of a vertical NAND (V-NAND). Advantageously, the direct tester may be used for accelerated process development. The direct tester eliminates the need of decoders or multiplexers which are normally required with conventional testing methods. In one example, the direct tester can have 256 channels to detect clustered Opens and Shorts and can provide easy electrical failure localization for Physical Failure Analysis (PFA). In one aspect of this disclosure the direct tester can detect open and shorted memory bit cell strings (pillars). It also detects open and shorted WL contacts and WL stripes (intra-layer and inter-layer).

Advantageously, the proposed method enables characterization of key memory elements—word lines (WLs) and Cell strings for defects and electrical fails (opens and shorts) and also characterization of Cell properties.

In some examples, the direct tester as taught by the present disclosure compared to the conventional microprobing can provide more statistical data about the memory bits/cells for the purpose if electrical characterization. In some examples, the direct tester can characterize semiconductor wafer dice with up to 8 million cell transistors per die by generating 8 million full sweep current-Voltage characteristics in test time below ten hours.

According to one aspect of this disclosure, the direct tester can be used to characterize memories in order to detect the defects which may be otherwise difficult to detect. Examples of 3D NAND defects include particles in the memory stack from "Tier" layer deposition (illustrated later in the FIG. 7). Depending on the size and placement of the particle, various failure modes in the memory array may occur. Especially during replacement metal gate (RMG) and WL processing, the high aspect ratio and 3D reentrant patterns make it very difficult to remove material, clean, and to perform a gap-fill. The direct tester can detect such defects caused by such depositions by characterizing a very large number of array elements through connecting WLs and channel holes, sufficient to obtain a statistical representation of fails in the whole array, and a large number of cells by direct testing, in other words a direct connection or coupling of a memory cell to a test probe.

Advantageously, the direct tester can be used to accelerate 3D V-NAND process integration and product ramp. Direct testing can be performed at the first metal level by customization of conductor routing and providing pads for massive parallel probing. More specifically, use of a direct tester can provide electrical information such as listed below:
  i. Front end of line (FEOL) bit cells with direct addressability within 3-D array
  ii. Kelvin resistance measurements of Channel Hole string resistances
  iii. Kelvin resistance measurements of WL contacts
  iv. Kelvin resistance measurements of WL resistance
  v. Capacitance measurements of the WL-WL inter-plane Capacitance
  vi. WL Shorts within the planar tier and between the tiers
  vii. String Pillar opens, and shorts
  viii. Direct tester can be designed to customize testability of every memory die, or selected dies within the reticle field.

In one aspect of this disclosure, word lines, bit lines, and select transistors, (also referred to as bit select lines) of a memory structure under test may be directly connected or coupled to word lines via test pads. The word lines and bit lines may be then selectively shorted to measure the electrical resistance of a particular word line. Furthermore, the word lines and bit lines may also be tested using a detector for electrical opens or shorts or to read an electrical parameter value such as voltage or current, resistance, or capacitance. In one example, the detector can include a control block and a user interface block. In one example, the direct tester is always connected to the word lines, bit lines, source lines, and channel holes before beginning the direct testing. Once connected the user interface may be used to decide the nature of tests to be perform on the connected word lines, bit lines, source lines, and channel holes. So tests include resistance, leakage, capacitance measurement, or full I-V curve sweep for cell characterization. The cell characterization tests may also include cell functionality tests e.g., its capability to change its state from a logic low "0" to a logic high "1" or vice versa. In addition, testing of Cell parametric characteristics like Threshold Voltage, Transconductance, etc.—as described in FIG. 16 description—can be performed. The detector may then store the results of testing and compare the results with predetermined values to generate an indication of good or bad memory segment due to failing lines, isolation, or non-functional memory cells. The results of such testing may then be used to identify defective memory cells. This method of testing may also be referred to as direct testing or direct probing. A testing device as such may also be referred to as a direct tester.

FIG. 1 illustrates a typical vertical NAND flash memory cell string with gates, a vertical channel, string select line (SSL), a bit line selector (BLS), and a source line selector (SSL) in planar view, planar rotated by 90 degrees, in cylindrical shape and its cross section as taught by the references L. Crippa and R. Micheloni, "3D Charge Trap NAND Flash Memories", in 3D Flash Memories, ed. R. Micheloni, Springer 2016, p. 86.

Figure 2:
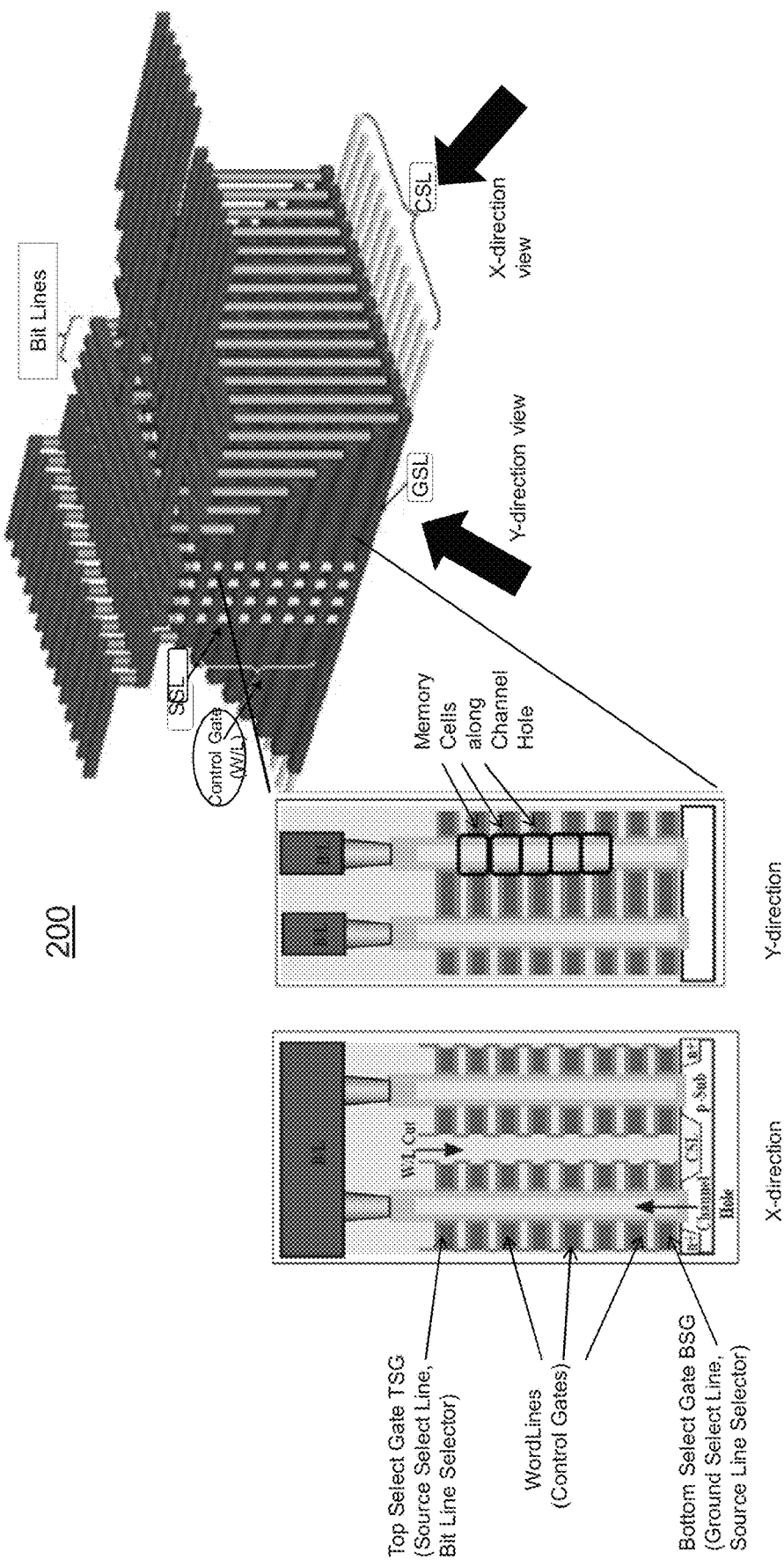
FIG. 2 illustrates an example 200 of array of a vertical NAND Flash Memory cells.

FIG. 2 illustrates an example of array of a vertical NAND Flash Memory cells, as shown in the references J. Jang, et al. (Samsung), "Vertical Cell Array using TCAT (Terabit Cell Array Transistor) Technology for Ultra High Density NAND Flash Memory", Digest of Technical Papers, Symposium on VLSI Technology, 2009, p. 192-193. Also shown are X-direction and Y-direction views of the memory structure. The X-direction view shows a W/L cut cross section of the memory structure with a Bit Line (BL) at the top and a p-Sub channel at the bottom. As can be seen Top Select Gate TSG (Source Select Line, Bit Line Selector), Word Lines (Control Gates), and Bottom Select Gate BSG (Ground Select Line, Source Line Selector) are in the middle. The Y-direction view shows Bit Lines (BLs) at the top and memory cells along the channel hole.

Figure 3:
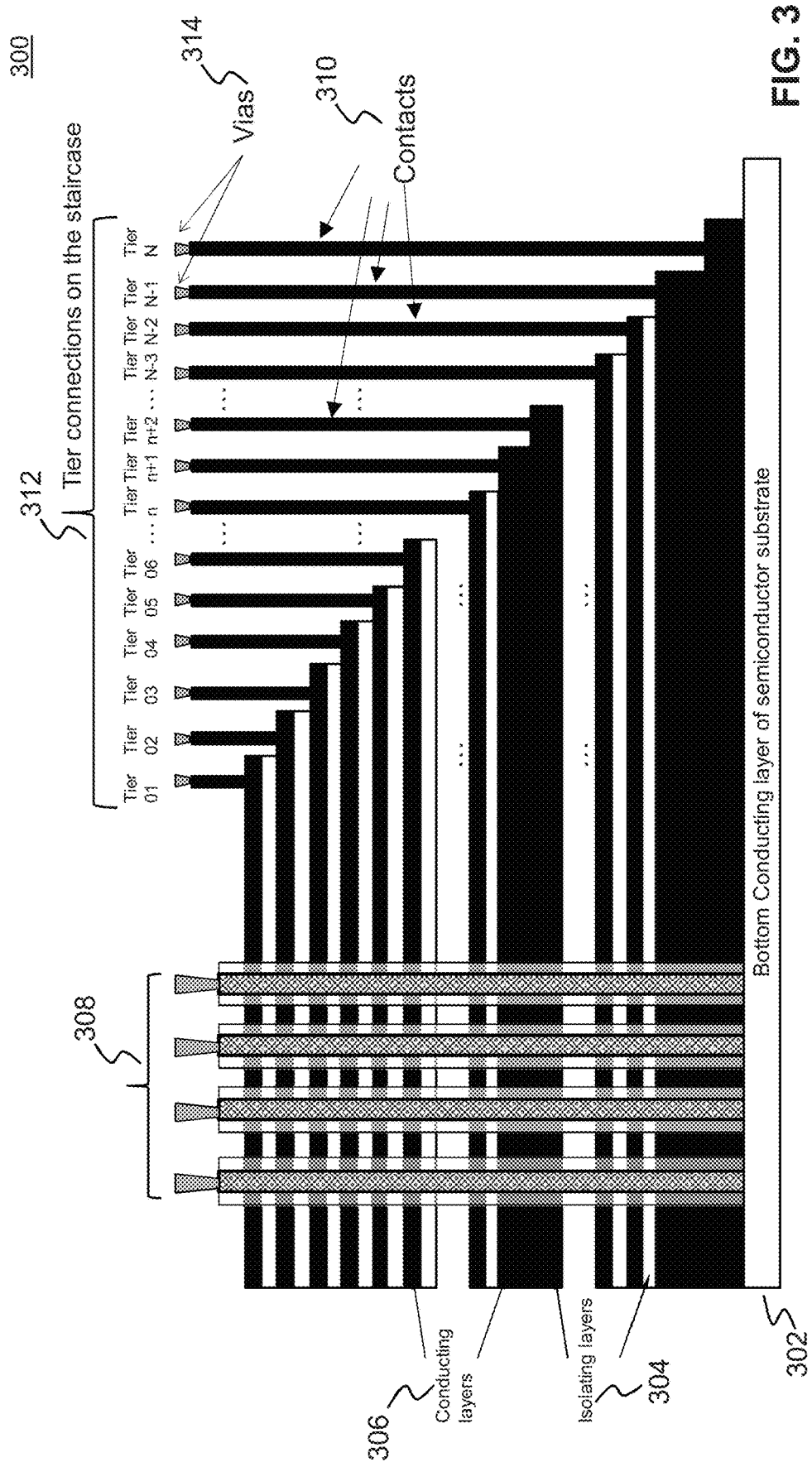
FIG. 3 illustrates an example 300 of stair case contacts and vias for a vertical NAND Flash memory structure process for making a vertical NAND memory structure of FIG. 2 according to the industry standard.

FIG. 3 illustrates an example cross section 300 of a 3D memory structure of the vertical NAND Flash memory structure of FIG. 2. The cross section 300 shows a bottom conducting layer 302 made of a semiconductor substrate. In one example the substrate may be a silicon substrate. The isolating layers 304 and conducting layers 306, collectively referred to as layers, reside above the bottom conducting layer 302. Due to the vertical arrangement of the memory structure, the layers (304 and 306) and therefore the contacts 310 of the vias 312 form a staircase pattern as shown. The vias 312 arranged as such are commonly referred to as staircase vias in the art. The top of the vias 312 may be seen as connected in multiple tiers from Tier 01, Tier 02, up to Tier N.

Figure 4B:
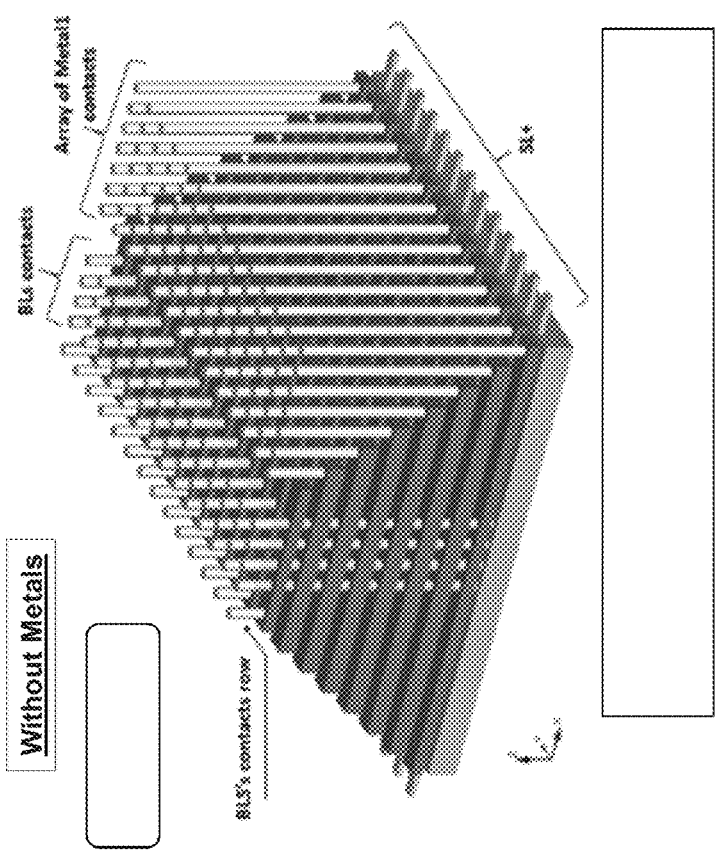
FIG. 4B illustrates an example 400B of 3D NAND memory process stopped just before the first interconnect level.
Figure 4A:
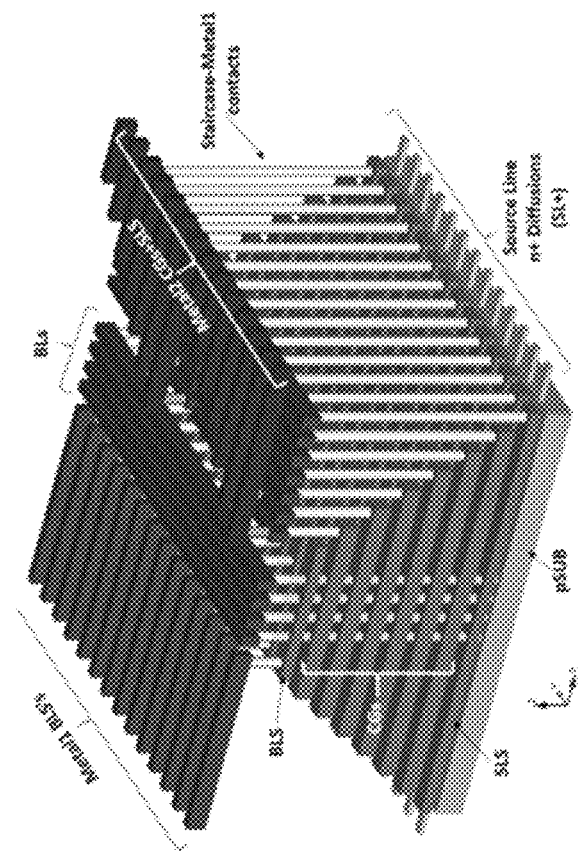
FIG. 4A illustrates an example 400A of a fully processed 3D NAND memory with Metal Interconnect layers on top of the 3D Memory Array.

FIG. 4A illustrates an example 400A of a fully processed 3D NAND memory with Metal Interconnect layers on top of the 3D Memory Array according to the drawing 3D NAND Cartoon (page 115) from the reference book "3D Flash Memories" R. Mecheloni ed. Springer 2016.

FIG. 4B illustrates an example 400B of 3D NAND memory process stopped just before the first interconnect level according to the drawing 3D NAND Cartoon (page 119) from the reference book "3D Flash Memories" R. Mecheloni ed. Springer 2016.

Figure 5B:
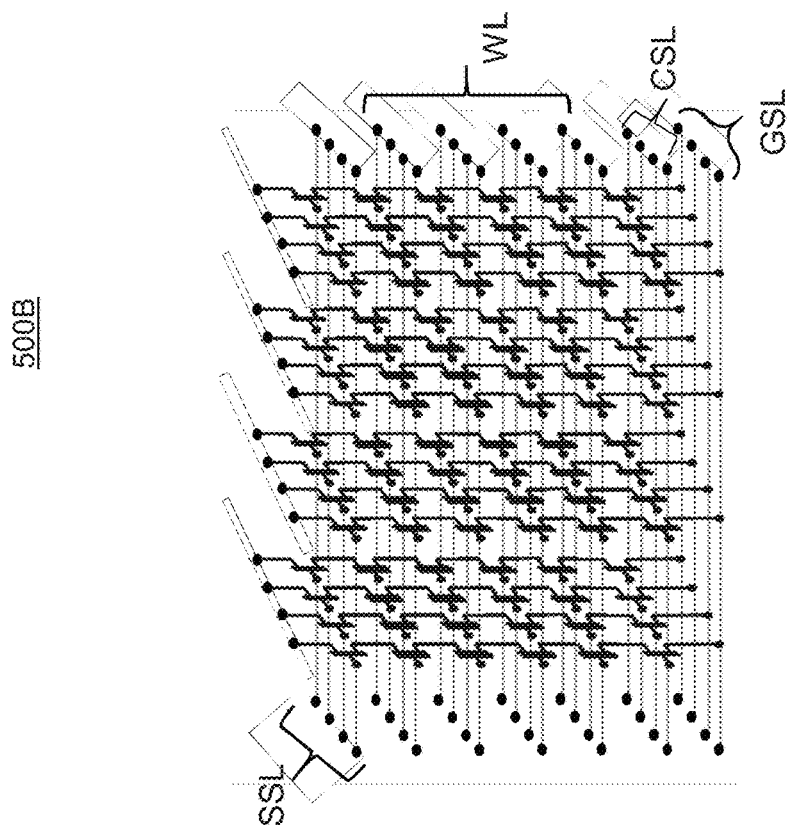
FIG. 5B illustrates an example 600B of an original 3D Memory Array with processing stopped just before the first interconnect level, and thus including no connection to peripheral circuitry, which may but does not have to be already present on the same substrate as the array.
Figure 5A:
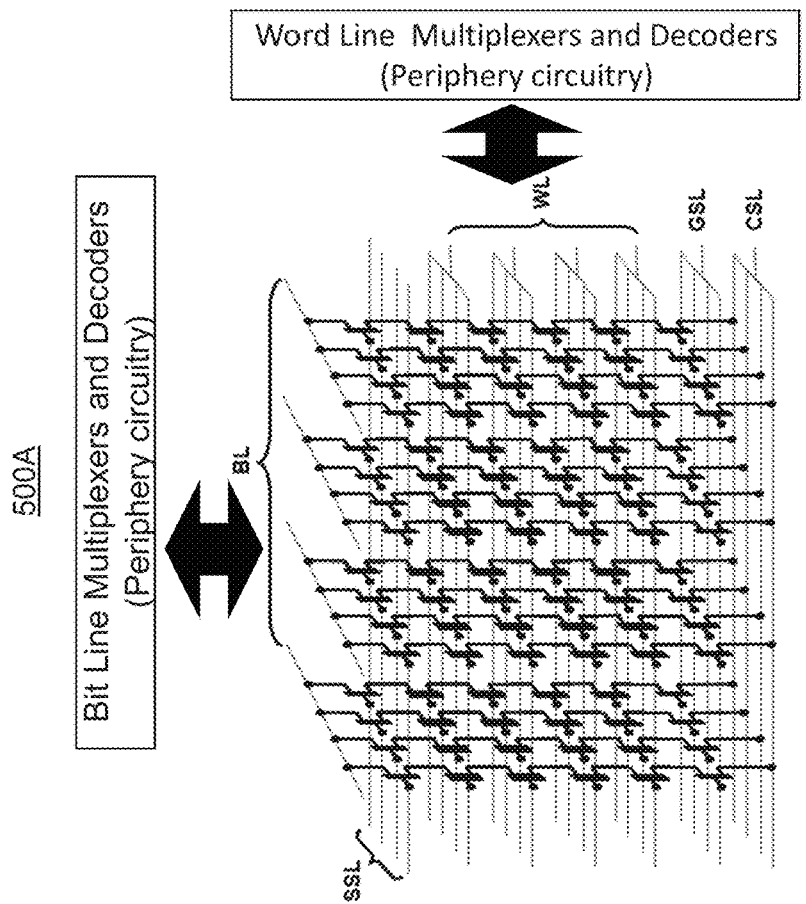
FIG. 5A illustrates an example 600A of an original 3D Memory Array connected to peripheral circuitry for operation and testing.

FIG. 5A illustrates an example 500A of an original 3D Memory Array connected to peripheral circuitry for operation and testing according to a reference J. Jang, et al. (Samsung), "Vertical Cell Array using TCAT (Terabit Cell Array Transistor) Technology for Ultra High Density NAND Flash Memory", Digest of Technical Papers, Symposium on VLSI Technology, 2009, p. 192-193. As shown the periphery circuitry includes Bit Line Multiplexers and Decoders and Word Line Multiplexers and Decoders.

Figure 6:
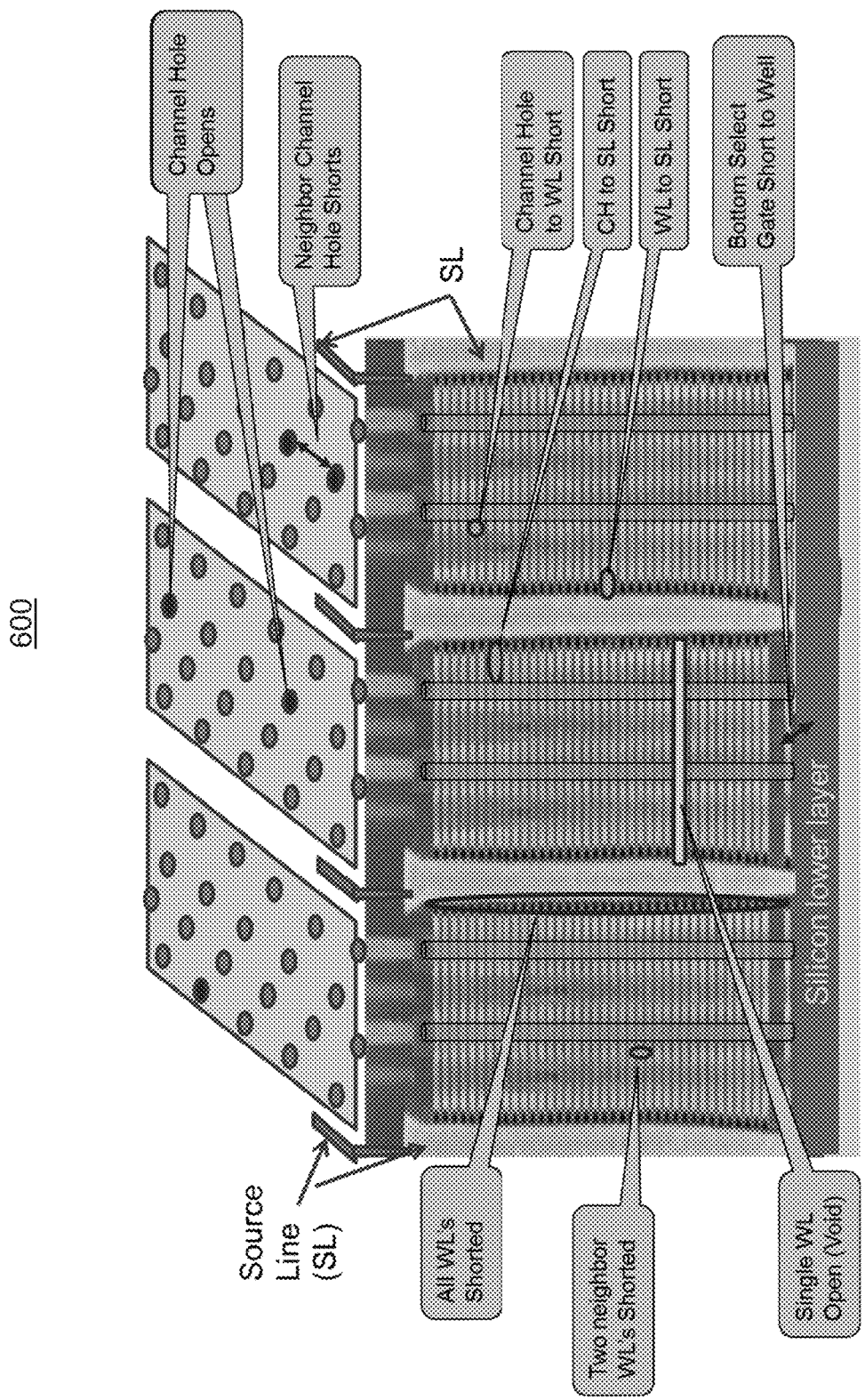
FIG. 6 illustrates an example 600 of a cross section of a 3D NAND memory structure with defects that are possible to happen in the array and of the normally occurring type.

FIG. 5B illustrates an example 500B of an electrical scheme of a 3D Memory Array as described in J. Jang, et al. (Samsung), "Vertical Cell Array using TCAT (Terabit Cell Array Transistor) Technology for Ultra High Density NAND Flash Memory", Digest of Technical Papers, Symposium on VLSI Technology, 2009, p. 192-193., which scheme is then modified as described herein for operation and testing, by creating memory structures having no connection to peripheral circuitry, which may but does not have to be already present on the same substrate as the array. The peripheral circuitry interconnects are disposed over the 3D memory structure of strings of memory cells arranged in an array and coupled between word lines and bit lines FIG. 6 illustrates examples of defects and failure modes in a 3D memory structure of FIG. 2. Examples of defects include channel hole (CH) to WL short, CH to source line (SL) short, WL to SL short, BSG short to well, all WL's shorted, two neighbor WL's shorted, Single WL Open (Void), CH opens, and neighboring CH shorts. These defects can cause failures of bits, strings, or whole blocks of memory. These defects can be detected with the direct tester of FIG. 7 as taught by the present disclosure. Further, the direct tester can detect most of the defects and related failure modes at channel holes and below. The direct testing method according to the present disclosure can provide high observability of the defects or failure modes by statistical sampling of 3D-NAND blocks.

Figure 7:
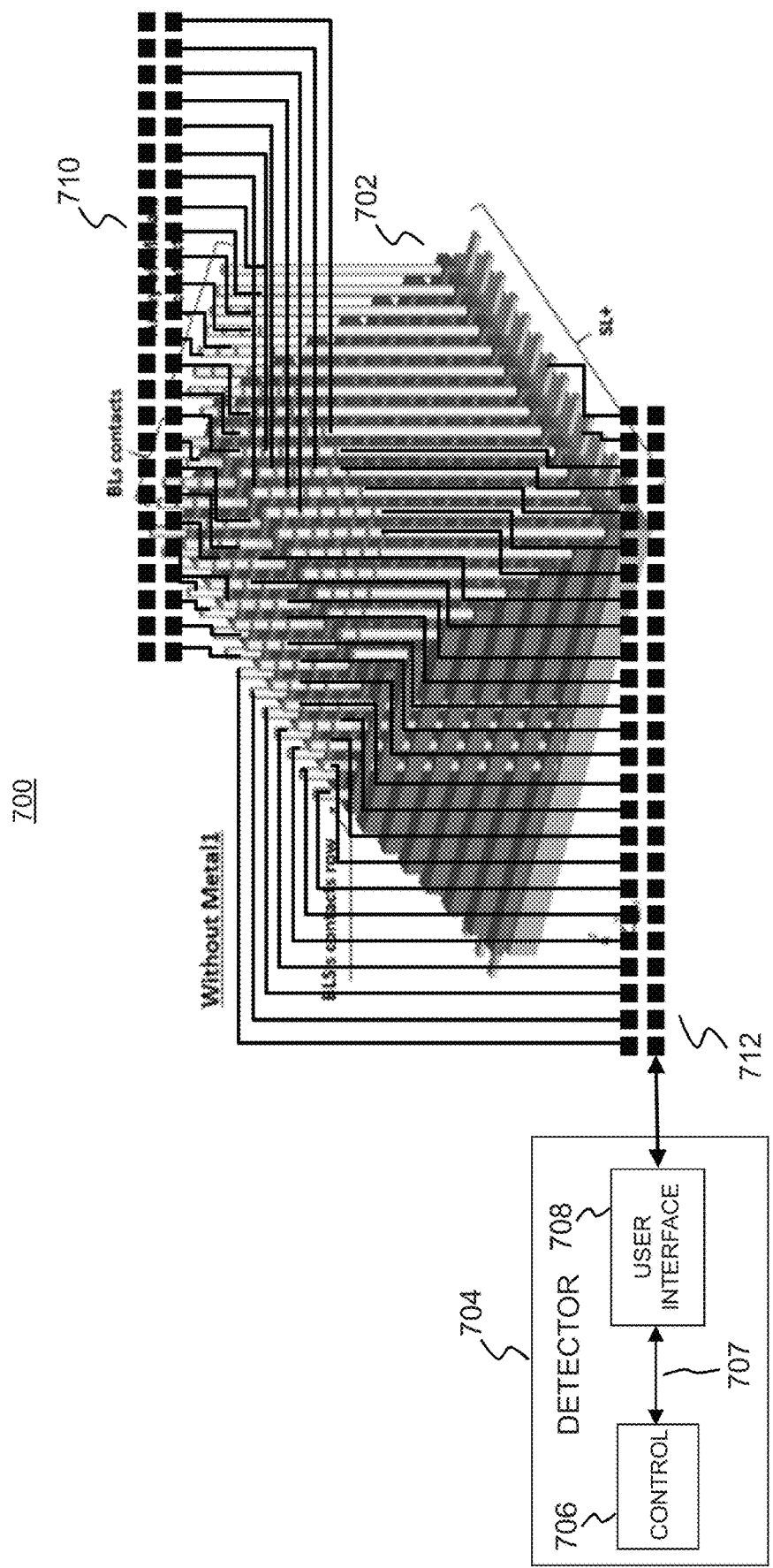
FIG. 7 illustrates an example of modifications to the interconnect levels in 3D memory array to enable direct testing, and an example of configuration 700 of a direct tester for the 3D memory structure of FIG. 4 according to the present disclosure.

FIG. 7 illustrates an example arrangement 700 of a direct tester for the 3D memory structure 702 according to the present disclosure. The structure 702 is similar to the memory structure 400B as shown in FIG. 4B. FIG. 7 is shown to include a detector 704, probe pads 710 and 712. In one example, the detector 704 may be referred to as a direct tester. The probe pads may also be referred to a test pads. The test pads can have a variable width compatible with the design rules of the specific technology of the memory structure to be characterized or tested. The detector 704 may further include a control block 706 and a user interface 708 with custom interconnect routing to probe pads to enable connection to selected terminals of the 3D array of FIG. 4B. Referring back to FIG. 5B, the test pads 710 and 712 provide direct connections to the SSLs, WLs, GSL, CSL, CHs, and BLs of the 3D memory 500B. Advantageously, the direct tester as such can be connected to the 3D memory array. As such the direct tester can test for opens and shorts among SSLs, WLs, GSL, CSL, CHs, and BLs by first interconnection those in various layouts or arrangements, then applying an electric potential (voltage) those, and then testing those for electrical continuity. In one example, the direct tester can perform specify any electrical test or sequence of tests (like initial test, stress, and post stress test, or test cycling) on the 3Dmemory structure under test. For example, one can measure the resistances of the WL by applying the constant voltage of arbitrary value (but below breakdown or damaging voltage) to the connection on one side of the array, and ground the other end of the WL at V=0, and measure the resulting current, and calculate the resistance. The same test can be applied to all directly connected WL's. Leakages and shorts can also be measured between any pairs of WL's, vertically stacked, or between horizontal neighbors. A constant voltage of arbitrary value (but below breakdown or damaging Voltage) would be applied to one WL or several WL's, while the other WL's would be grounded at voltage=0, and the currents can be measured flowing from WL to neighboring WL's to detect a short or a leakage path. To detect a non-linear resistive short, one can perform a voltage sweep test, where the voltage applied may not be constant, but comprises small voltage steps between V=0 and some arbitrary voltage value. At each step a current may be measured and a resistance may be calculated. Based on the I-V plot and the resistance value, the nature of the short and leakage path may be understood. In general memory array cells may also have defective or weak spots (other than opens or shorts at time zero) which may cause reliability issues during memory operations. The testing method taught by this disclosure may also be used to test such weak spots. For this purpose, the memory array under test may be exposed to a number of stress tests, where various voltage waveforms or patterns such as a constant voltage or voltage pulses or voltage sweeps having voltage values substantially close the values which can almost damage the memory cells (over voltage values). The array can then be retested to compare the presence of opens and shorts with the initial open or shorts to check if any new opens or new ones are present as an effect of the stress.

Figure 8:
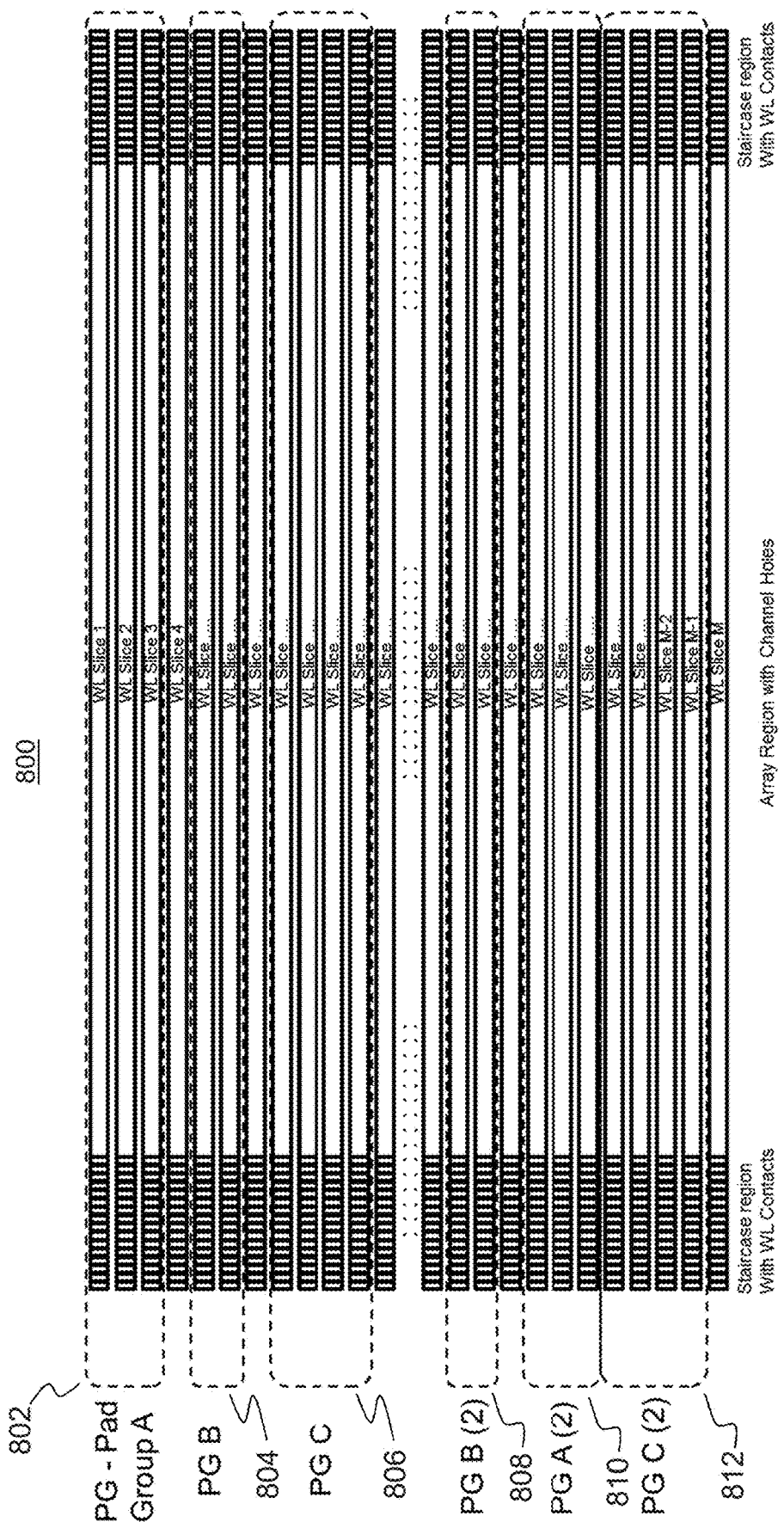
FIG. 8 illustrates an example 800 of slices of a 3D NAND memory structure for direct testing according to the present disclosure.

FIG. 8 illustrates an example of placement of various s Test PadGroups across a 3D memory array. Top view of the memory array shows how Pad Groups with pads for Direct Testing can be distributed across the array according to the present disclosure. In one aspect, the FIG. 8 also teaches a method to perform a direst test in any portion of the memory array or as whole. The method includes setting up creating a layout with a probe pad group (PG) for a test operation in which a direct test is to be performed. Several layouts can be replicated and distributed across the whole area of the memory array by creating multiple pad groups. The various pad groups may be used in combination to test different areas of the memory array. FIG. 8 illustrates a plurality of pad groups (PG) A, PG B, PG C, PG A (2), PG B (2), and PG C (2). Each pad group includes a few WL slices. Depending on the number of WL slices, any number of pad groups may be created for any number of test operations as explained earlier with respect to FIG. 6. For example, PG A may be used to test CH to WL short, while PG A(2) may be used to test CH to SL short. As such combinations of separate pad groups may be used to test various combinations of possible defects in the 3D memory structure.

Figure 9:
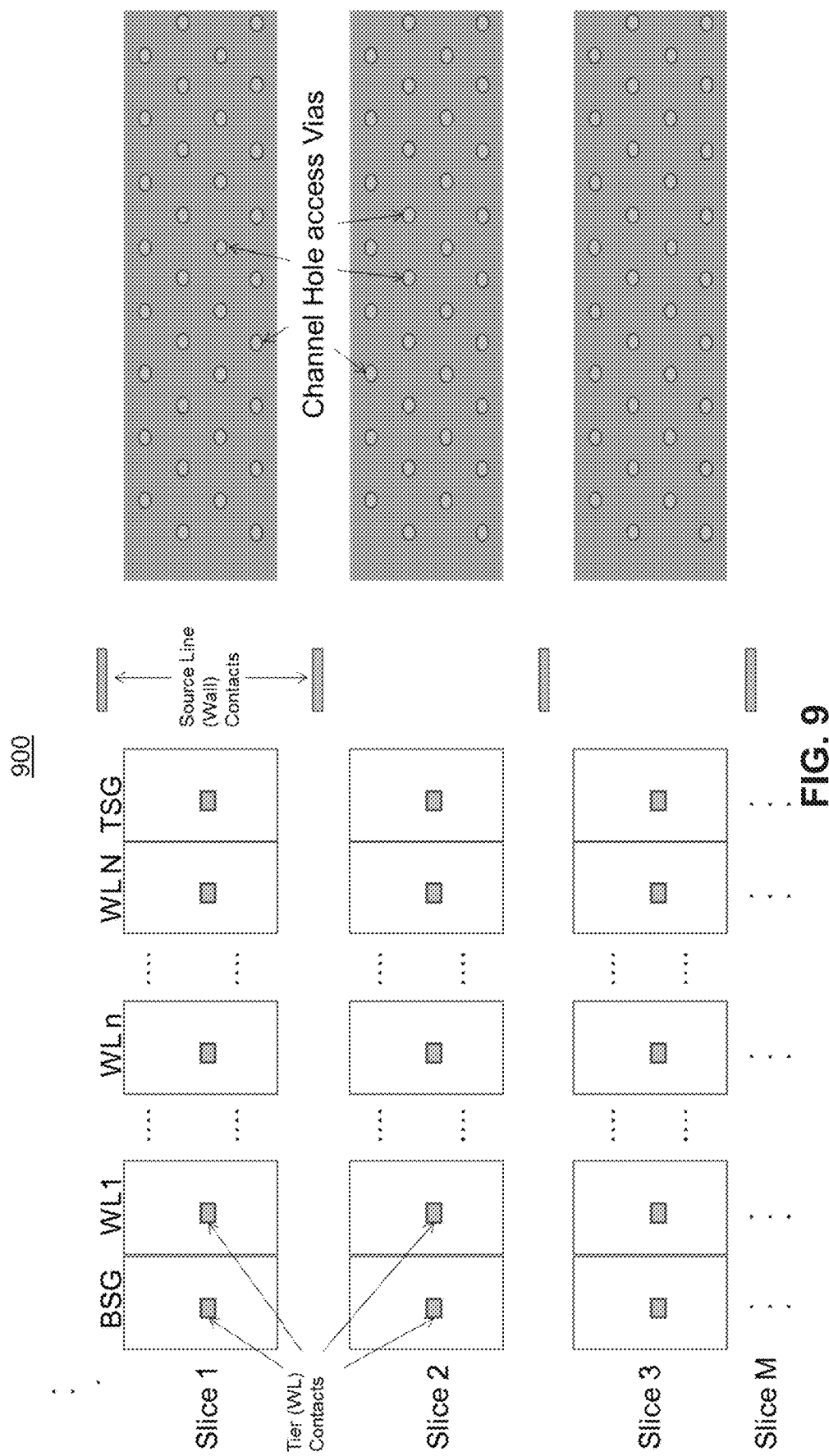
FIG. 9 illustrates a top view 900 of a small segment of 3D memory structure 400B of FIG. 4B for direct testing according to the present disclosure.

FIG. 9 illustrates a top view 900 of a test chip memory array structure 400B of FIG. 4B. In other words, FIG. 9 illustrates a top view of the 3D memory array just before fabrication of the first interconnect layer above the 3D array. The top view 900 shows channel holes (CH) access vias, tier (WL) contacts, and source line (wall) contacts. Contacts and vias to WLs, channel holes, and SLs are accessible from the top. More specifically FIG. 9 illustrates top views of the 3D memory structure divided into a plurality of cross sections or slices. Illustrated are slice 1, slice 2, slice 3, up to slice M. Each slice includes a BSG, a TSG, and a plurality of word lines e.g., WL1 up to WL N.

For the FIGS. 11, 12, 13, 14, 15, and 16, the top view of the memory structure is similar to the top view shown in FIG. 9. Also it is assumed that the 3D memory structure is divided into up to slices 1, 2, 3, up to M. It is further assumed that each slice includes a BSG, a TSG, and a plurality of word lines e.g., WL1 up to WL N. Thus, there can be up to M×(N×WL) connections on each side of the memory structure, and up to M×(N+2) WL connections in total for the entire 3D memory structure under test.

Figure 10:
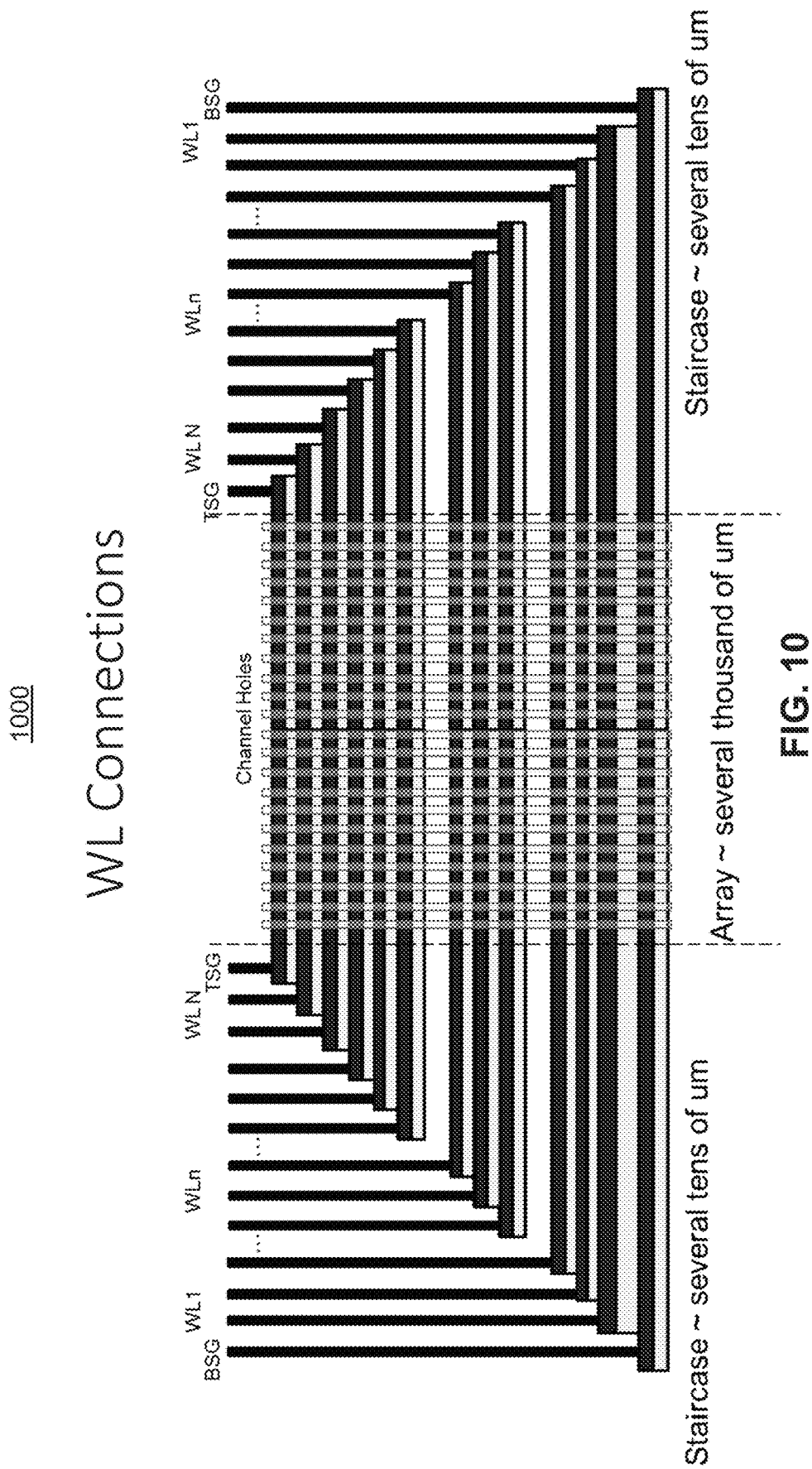
FIG. 10 illustrates a cross sectional view 1000 of the 3D memory structure of FIG. 2. showing WL connections on both sides of the array.

FIG. 10 illustrates a cross sectional view 1000 of the 3D memory structure of FIG. 2. showing contact connection to WL tiers on staircases on both sides of the array. According to the present disclosure, the probe pads 710 and 712 of the direct tester of FIG. 7 are connected to the word lines WL 1, WL 2, up to WL N are connected on either side of the memory structure. As such, the word lines can be tested for their resistances, and opens and shorts to other word lines easily.

Figure 11:
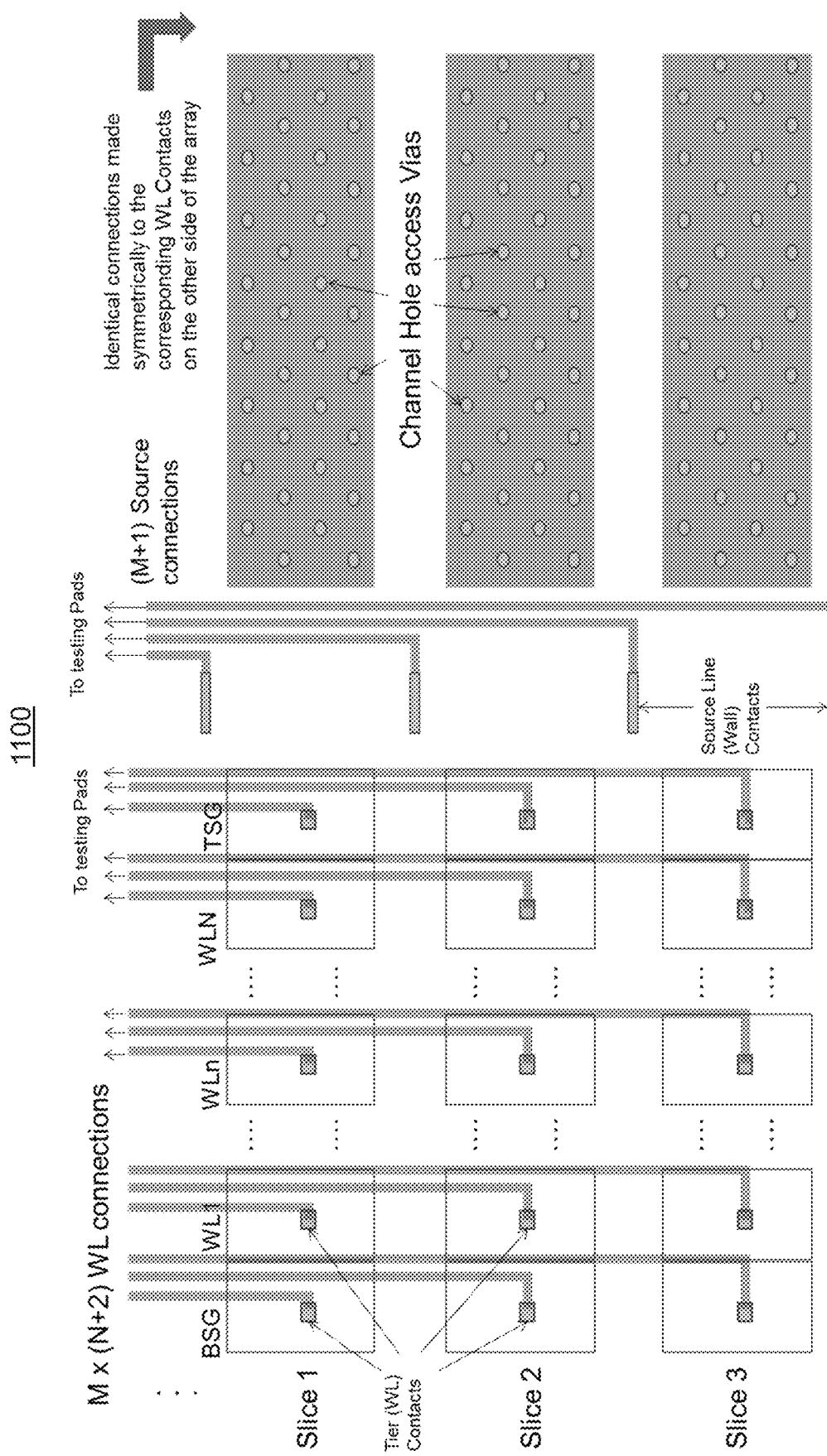
FIG. 11 illustrates a first example of a layout for direct testing of a 3D memory structure of FIG. 2 according to the present disclosure.

FIG. 11 illustrates a first example 1100 of a layout for direct testing of a 3D memory structure of FIG. 2 according to the present disclosure. More specifically, the layout 1100 can be used for direct testing of the opens and shorts between WLs as shown in FIG. 10 for a 3D memory structure of FIG. 2. The top view of the memory structure is similar to the top view shown in FIG. 9. In one example, the layout 1100 enables direct testing of resistances and capacitances as well. In this each WL, BSG, TSG, SL (wall contact) is connected to separate probe pads.

Figure 12:
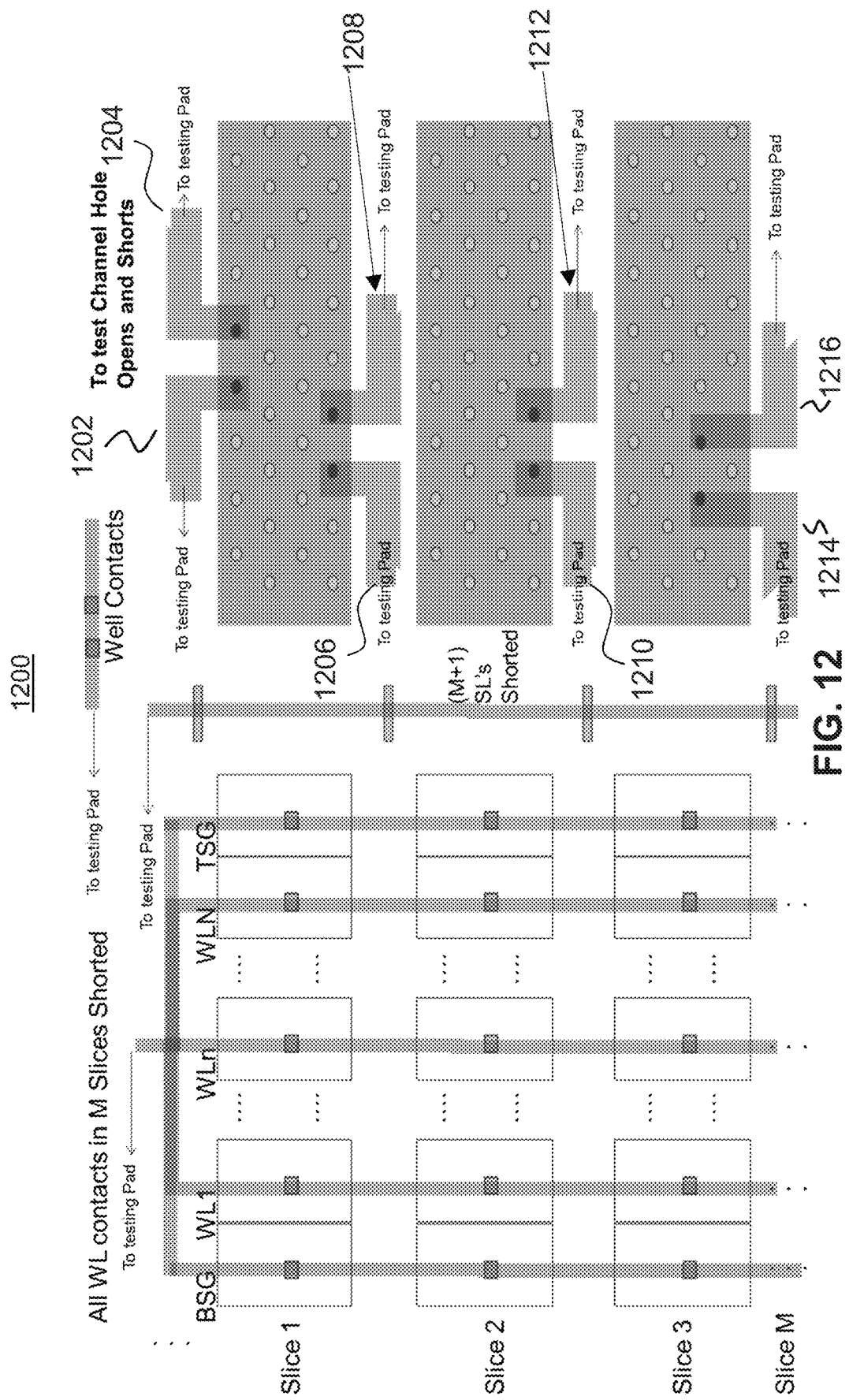
FIG. 12 illustrates a second example of a layout for direct testing of a 3D memory structure of FIG. 2 according to the present disclosure.

FIG. 12 illustrates a second example 1200 of a layout for direct testing of a 3D memory structure of FIG. 2 according to the present disclosure. More specifically, the layout 1200 can be used for direct testing of the channel holes opens and shorts in a 3D memory structure of FIG. 2. The top view of the memory structure is similar to the top view shown in FIG. 9. As shown, in this layout all WL contacts in all the slices may be shorted in order to test the channel hole opens and shorts. In one example, the WLs, BSG, TSG, SLs are all shorted together. The test pads 1202, 1204, 1206, 1208, 1210, 1212, 1214, and 1216 are all connected directly to the channel holes that need to be tested for shorts.

Figure 13:
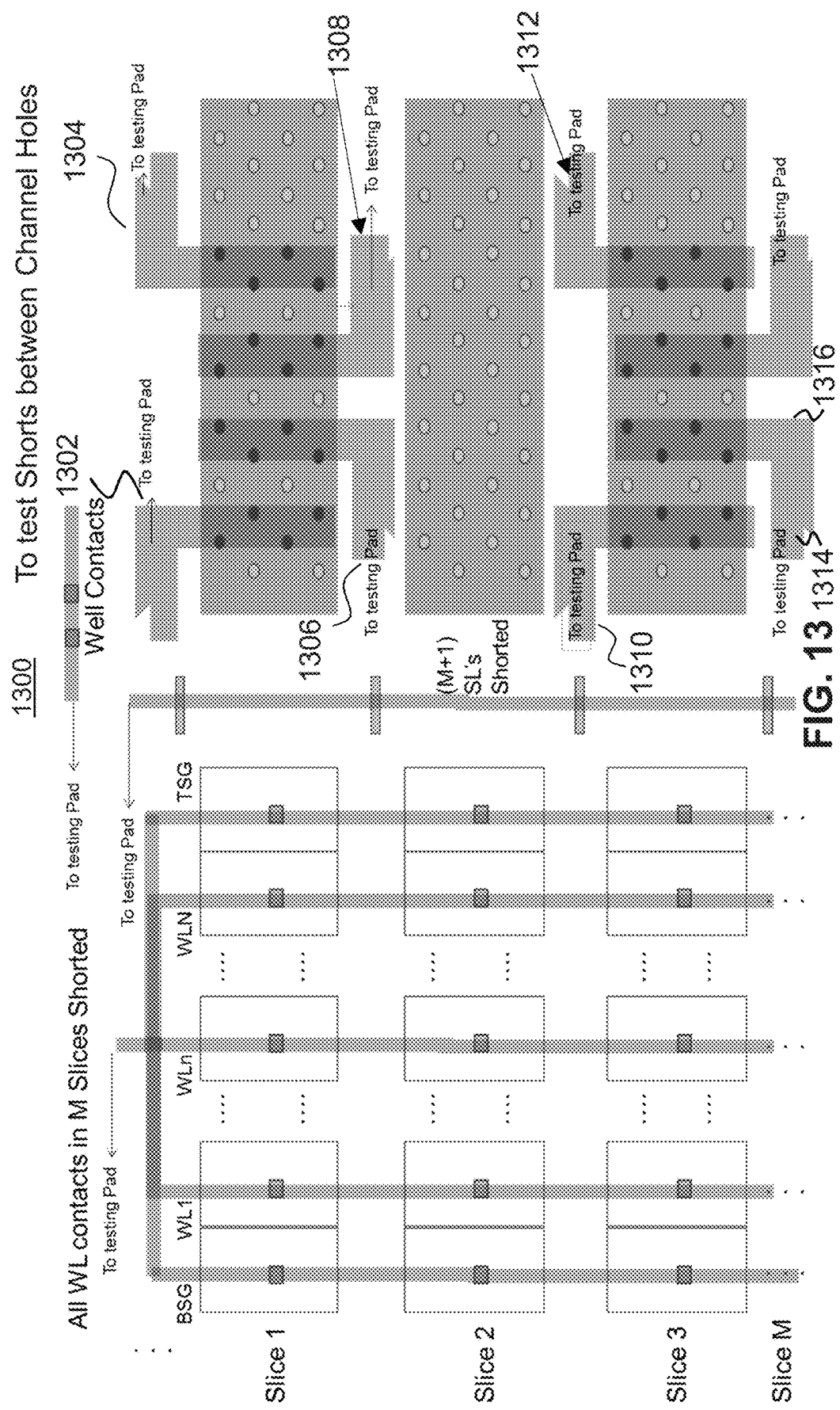
FIG. 13 illustrates a third example of a layout for direct testing of a 3D memory structure of FIG. 2 according to the present disclosure.

FIG. 13 illustrates a third example 1300 of a layout for direct testing of a 3D memory structure of FIG. 2 according to the present disclosure. More specifically, the layout 1300 can be used for direct testing of channel hole shorts in a 3D memory structure of FIG. 2. The top view of the memory structure is similar to the top view shown in FIG. 9. In this layout, channel hole shorts between neighbor channel holes, as well as channel hole shorts to WL's can be tested. In one example, the WLs, BSG, TSG, SLs are all shorted together. Each of the test pads 1302, 1304, 1306, 1308, 1310, 1312, 1314, and 1316 is connected directly across a plurality of channel holes that need to be tested for shorts.

Figure 14:
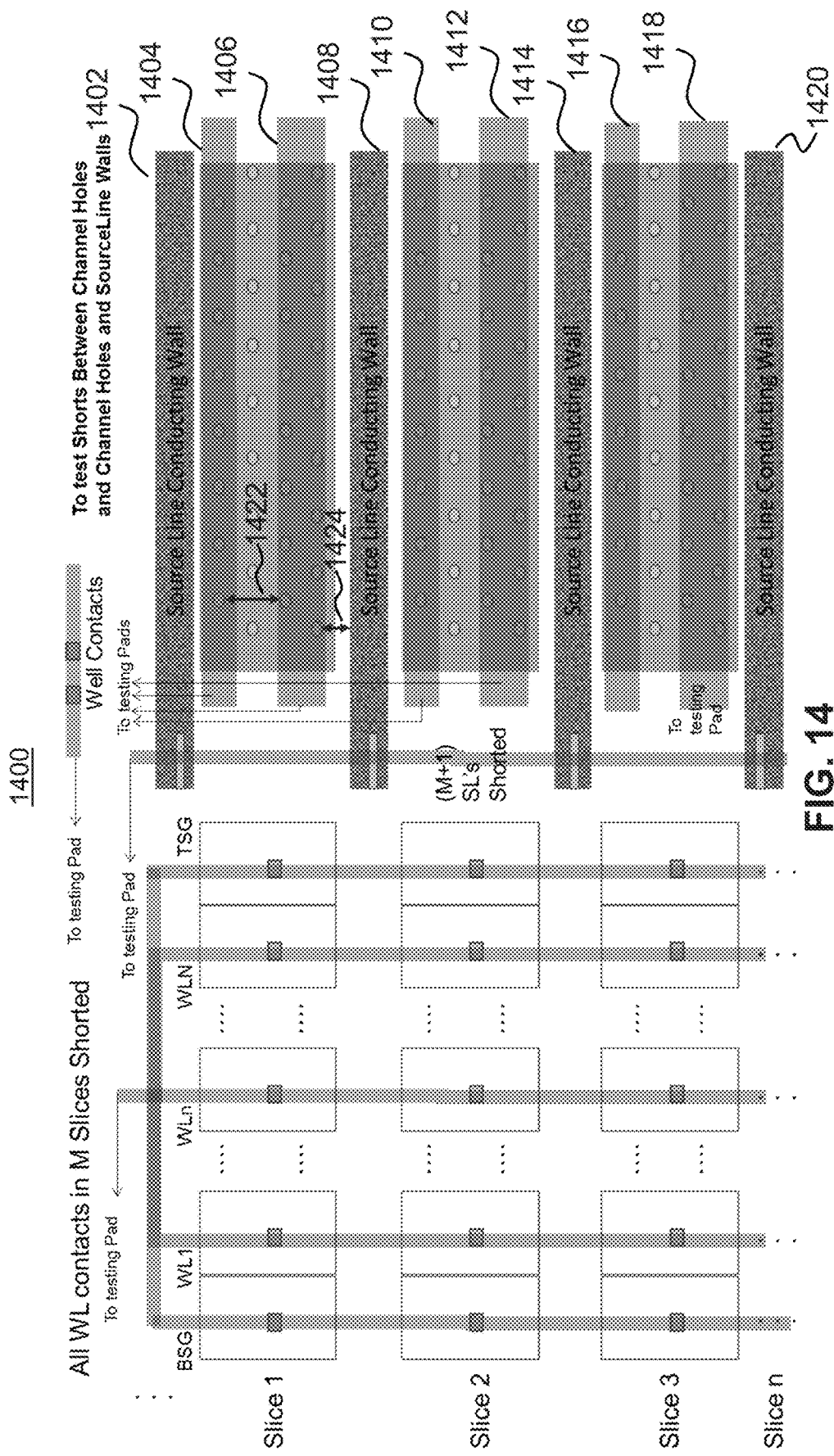
FIG. 14 illustrates a fourth example of a layout for direct testing of a 3D memory structure of FIG. 2 according to the present disclosure.

FIG. 14 illustrates a fourth example 1400 of a layout for direct testing of a 3D memory structure of FIG. 2 according to the present disclosure. More specifically, the layout 1400 can be used for direct testing of shorts between channel holes; and shorts between channel holes and source line walls. The top view of the memory structure is similar to the top view shown in FIG. 9. This layout focuses on detecting channel hole shorts along a slice, as well as channel hole shorts to the neighboring source lines. In one example, the WLs, BSG, TSG, SLs are all shorted together. Source line conducting walls 1402, 1408, 1414, and 1420 are all shorted together. The test pads 1404, 1406, 1408, 1412, 1414, 1416, 1418, and 1420 are connected horizontally across a plurality of channel holes that need to be tested for shorts. The arrows show potential area for shorts, which can be detected in the memory structure, similar to the neighbor channel hole short shown in FIG. 6.

Figure 15:
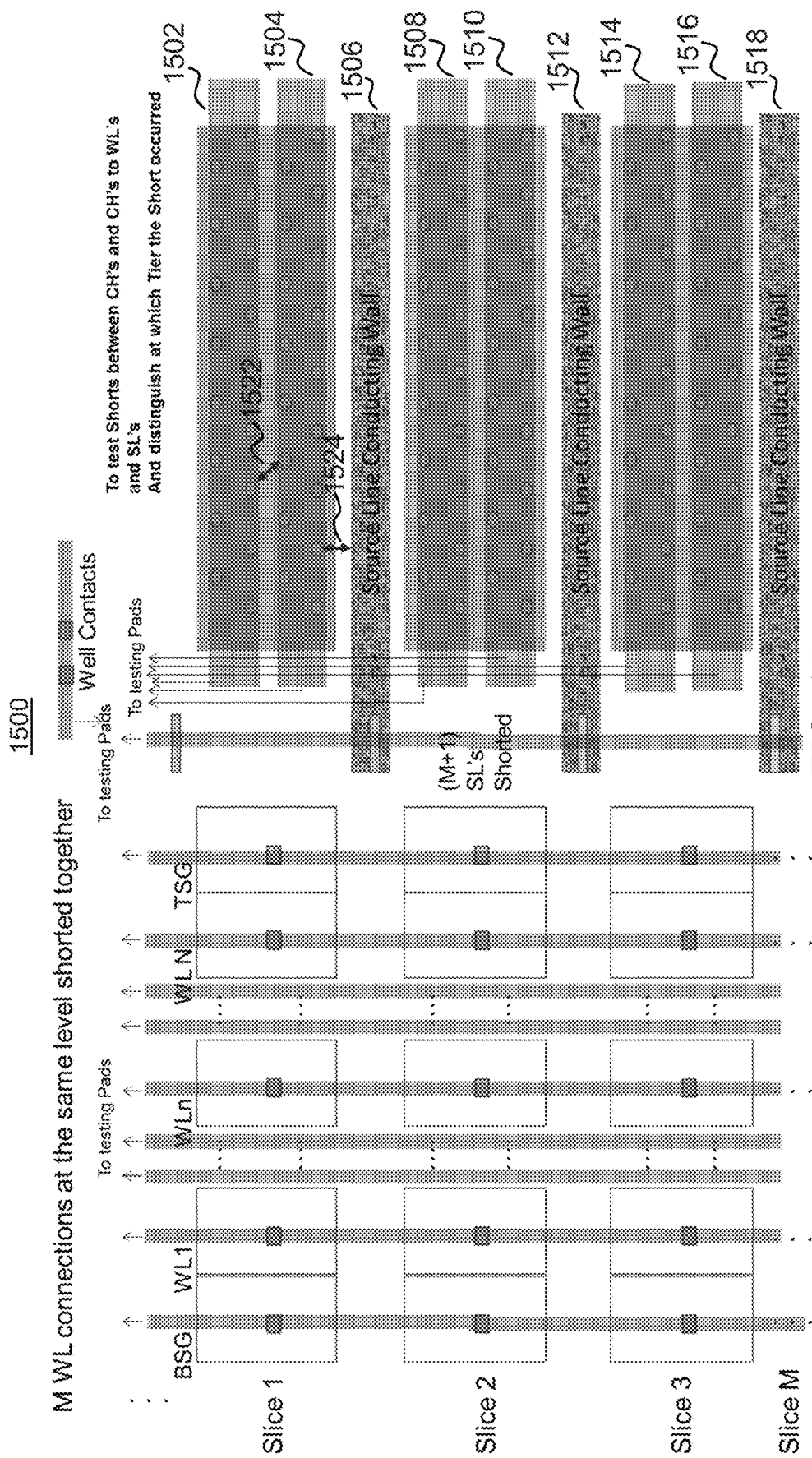
FIG. 15 illustrates a fifth example of a layout for direct testing of a 3D memory structure of FIG. 2 according to the present disclosure.

FIG. 15 illustrates a fifth example of a layout for direct testing of a 3D memory structure of FIG. 2 according to the present disclosure. More specifically, the layout 1500 can be used for direct testing of shorts channel holes, between channel holes to word lines, and between channel holes to source lines. The top view of the memory structure is similar to the top view shown in FIG. 9. This layout focuses on detecting channel hole shorts along a slice, as well as channel hole shorts to the WL. This layout also allows a selective detection of a WL or a Tier where a possible short may be present. As shown, BSG, WLs, TSG connections at the same level in each slice are shorted together. For example, BSG, WL1, and TSG from slices 1, 2, and 3 are shorted together. Source line conduction walls 1506, 1512, and 1518 are shorted together. The test pads 1502, 1504, 1508, 1510, 1514, and 1516 are connected horizontally across a plurality of channel holes that need to be tested for shorts.

Figure 16:
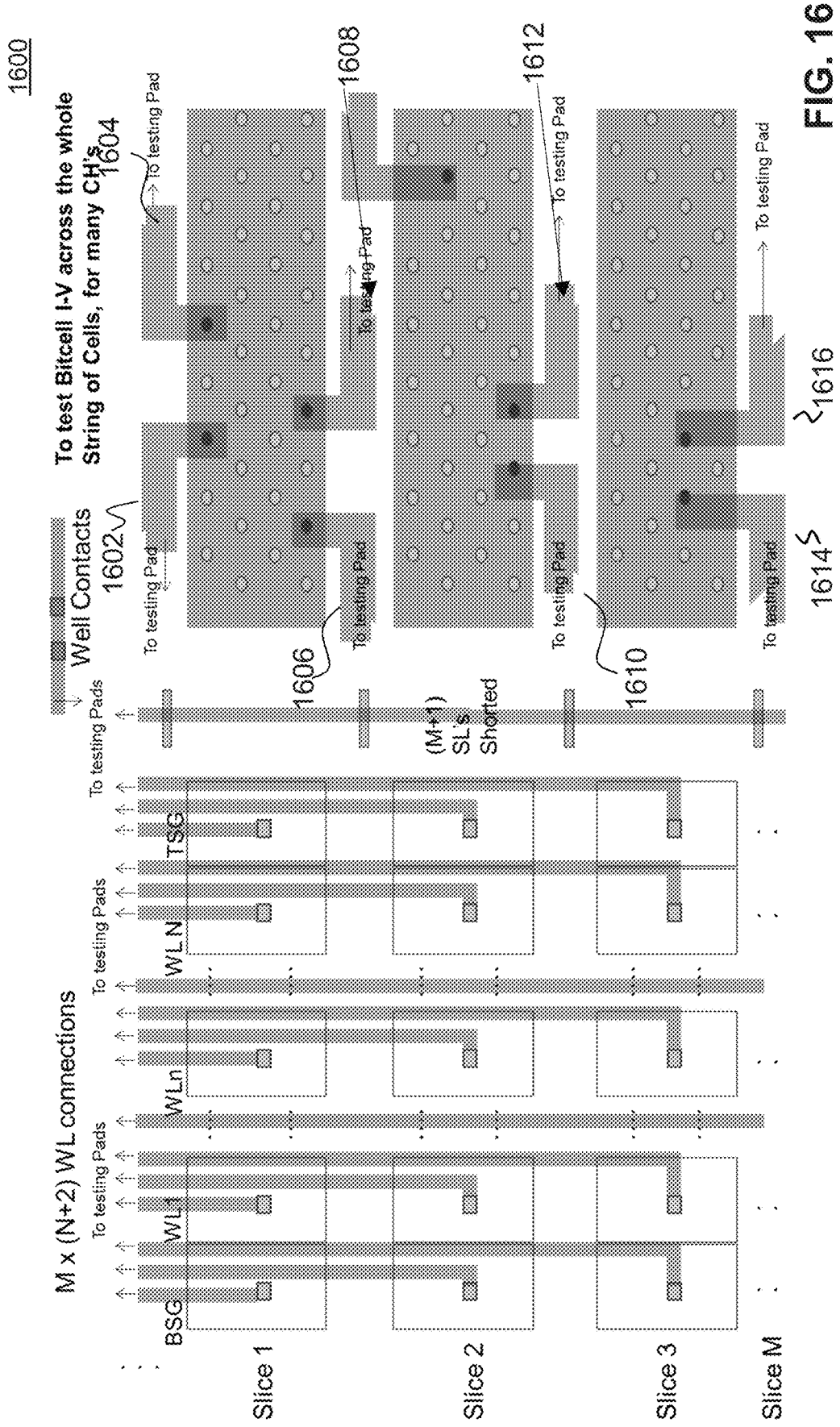
FIG. 16 illustrates a sixth example of a layout for direct testing of the 3D memory structure of FIG. 2 according to the present disclosure.

FIG. 16 illustrates a sixth example of a layout for direct testing of a 3D memory structure of FIG. 2 according to the present disclosure. More specifically, the layout 1600 can be used for direct testing of I-V characteristics of memory cells in a string along a channel hole (for multiple channel holes in parallel). The source lines are all shorted together. The probe pads 1602, 1604, 1606, 1608, 1610, 1612, 1614, and 1616 are directly connected to separate channel holes. The cells are tested to determine both functional and parametric properties, like trans-conductance, leakage, sub-threshold slope of the I-V characteristics, the threshold voltage Vt, as well as the proper response to programing and erasing functions. For that, a set of pre-determined voltages are applied to the WL's controlling the string, and one cell from the string is measured by applying a sweep voltage to the WL corresponding to this cell, while all other WL have a constant voltage applied to keep all other cells on that string conductive. The current is measured on the BL contact which is connected by direct testing to the pads and then to the test system. The measured I-V curves are analyzed and trans-conductance, sub-threshold swing, and threshold voltage, and other parameters may be extracted and used for quantifying the cell quality. Furthermore, the memory program and erase operations can be applied to the cells on the string connected to direct testing pads, by applying corresponding program and erase voltage pulses as prescribed in the memory array operation. After that the parametric measurements of cell properties can be performed again and the results can be compared to initial values, and be used to further determine the quality of the cells. The program and erase operations can be combined into sequences and used to check endurance and retention of the data programmed into the cells. The test types which can be applied to the cells and the array is not limited to the examples given above, but include large number of electrical characterization and reliability tests, which can be performed with parametric or digital tester connected directly to array terminals described herein.

Figure 17B:
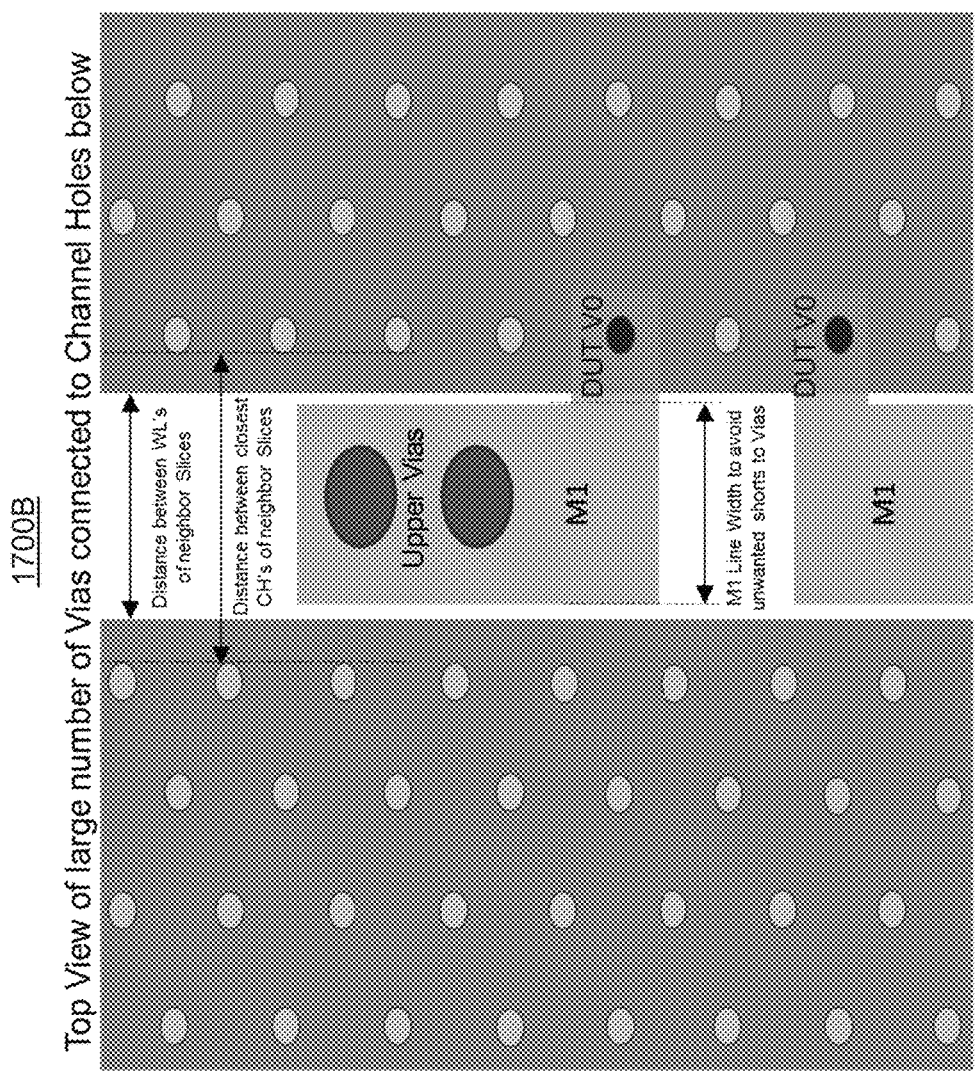
FIG. 17B illustrates an example of implementation of a metal connection routing inside the memory array, with the top view 1700B of the upper vias and channel holes of the 3D NAND memory structure of FIG. 2.
Figure 17A:
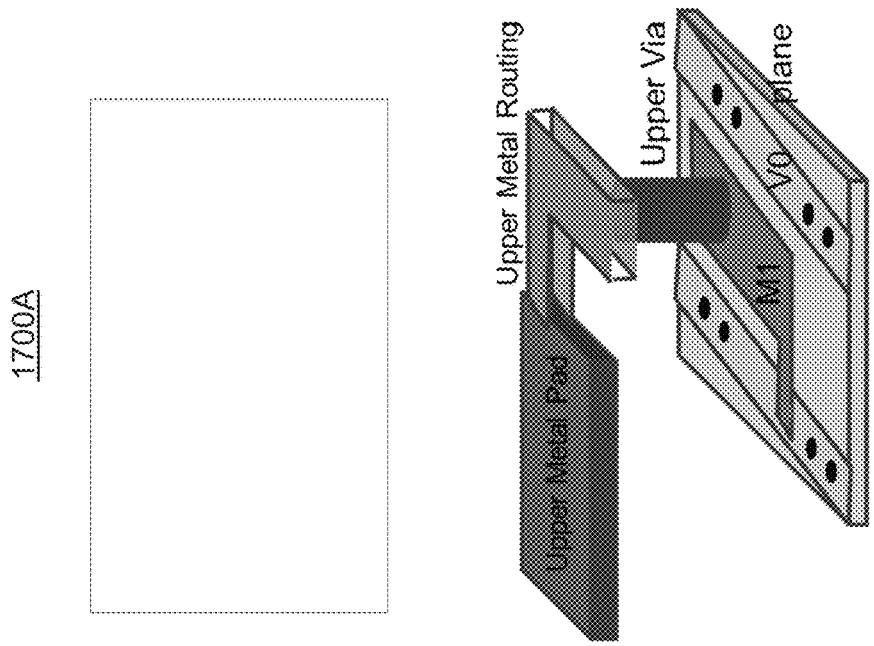
FIG. 17A illustrates an example 1700A of a metal connection routing within the 3D memory structure of FIG. 2 according to the present disclosure.

FIG. 17A illustrates an example 1700A of a metal connection routing within the 3D memory structure to be directly connected to the channel hole vias. Illustrated are channel holes V0, an upper via, an upper metal routing, metal 1 (M1), and an upper metal pad of a 3D NAND memory structure under test. As shown, M1 pattern serves as an immediate connector between channel holes. Upper metal is used for routing layer and pad layer.

FIG. 17B illustrates an example top view 1700B of upper vias and channel holes of the 3D NAND memory structure of FIG. 2. More specifically a top view of upper vias and channel holes with metal connections routing to be directly connected to the channel holes can be seen. As shown M1 patterns serve as immediate connectors between channel holes. M1 patterns can also be used to maintain a minimum line width to avoid unwanted shorts to neighboring vias.

FIG. 18 illustrates a table (Table 1) 1800 which lists example defects in a 3D memory structure, possible failure modes, and failure mode detection performed by the direct tester or the direct testing method according to the present disclosure. Each of the above mentioned defects may lead to few possible failure modes in the memory structure which may be detected using the direct tester or the direct testing method according to the present disclosure. For example, a first possible defect may be a particle in the tier stack deposition (no. 1), which may result in incompletely etched channel hole (s) or shorted channel holes or Open WL Contacts or Shorted WL Contacts or Shorted neighbor WL's within same Tier layer or Shorted WL between subsequent Tier layers. For any of the above failure modes, the direct tester may detect an electrical open of bit strings or electrical shorts between neighboring strings or open word lines or shorted word line (intra-layer vs. inter layer separation).

Similarly, a second possible defect may be blocked or incomplete WL separation etch (no. 2), which may result in shorted neighbor WL's across multiple tier layers at the bottom of the stack or open WL (in W RMG integration), which may be detected by the direct tester as word line shorts or word line opens.

A third possible defect may be incompletely removed dummy gate or blocked RMG deposition. This may result in making the bit cell string permanently open (cannot tun-on). The direct tester may detect this by open word line or by detecting multiple non-cobit strings which are not continuous (discontinuous bit strings).

A fourth possible defect may be blocked or incompletely filled poly pillar. This may result in an open channel hole (bit cell string) or may impact the continuity of the bit cells in general.

A fifth possible defect may be gate dielectric stack defects. This may result in a gate to bit string short (pillar to WL short). The direct tester may detect this as by word lines shorted to the bit strings.

A sixth possible defect may be incomplete contact etch (under etch) or contact over etch. This may result in an open WL contact or a contact connected to two or more tier layers.

The direct tester may detect this by an open WL or shorted WLs between subsequent WL levels.

The above mentioned defects, failure modes, and detection with direct tester are only examples and should not be considered limiting.

It should be readily apparent to those of ordinary skill in the art that various changes, modifications and substitutes are intended to the embodiments described herein, within the form and details thereof, without departing from intended spirit and scope. Accordingly, it will be appreciated that in numerous instances some features will be employed without a corresponding use of other features. Further, those skilled in the art will understand that variations can be made in the number and arrangement of components illustrated in the above figures.

The invention claimed is:

1. A method for testing a vertical memory structure disposed on a semiconductor substrate, the method comprising:
    creating, from a wafer containing a plurality of 3D memory devices, including at least one direct connect 3D memory device;
    wherein some of the plurality of 3D memory devices include peripheral circuitry interconnects disposed over a first 3D memory structure comprising strings of memory cells arranged in an array and coupled between word lines and bit lines;
    wherein the at least one direct connect 3D memory device has no peripheral circuitry interconnects, and is disposed over a second 3D memory structure constructed the same as the first 3D memory structure comprising the strings of memory cells arranged in the array and coupled between the word lines and the bit lines of the some of the plurality of 3D memory devices;
    wherein the step of creating includes providing a testing interconnect structure including test pads over the second 3D memory structure of the at least one direct connect 3D memory device that allows direct electrical connections to the word lines and the bit lines associated therewith;
    directly connecting a direct tester to predetermined ones of the test pads of the at least one direct connect 3D memory device; and
    using the direct tester, applying a predetermined voltage to the at least one direct connect 3D memory device to test the electrical integrity of the second 3D memory structure of the at least one direct connect 3D memory device.

2. The method according to claim 1, wherein the electrical integrity is one of an open, a short and a leakage of at least one memory cell in the second 3D memory structure.

3. The method according to claim 2, wherein the direct tester is used to further test resistance and capacitance of at least one memory cell in the second 3D memory structure.

4. The method according to claim 3, wherein the direct tester is further used to test threshold voltage and conductance of at least one memory cell in the second 3D memory structure.

5. The method of claim 4, wherein the direct tester tests multiple ones of the memory cells in the second 3D memory structure in parallel.

6. The method of claim 5, wherein at least 128 memory cells are tested in parallel.

7. The method of claim 1, wherein the direct tester tests multiple ones of the memory cells in the second 3D memory structure in parallel.

8. The method of claim 7, wherein at least 128 memory cells are tested in parallel.

9. The method according to claim 1, wherein the step of using the tester includes parallel testing with connections made to certain ones of the test pads across the array of the second 3D memory structure to allow detection of a particular failure mode and enable localization of the failure.

10. The method according to claim 1, wherein the step of using the tester includes overstressing or applying prolonged or cyclical test under various conditions to at least one memory cell in the second 3D memory structure.

11. The method according to claim 10, wherein the step of using the tester includes parallel testing with connections made to certain ones of the test pads across the array of the 3D memory cells to allow detection of a particular failure mode and enable localization of the failure.

12. The method according to claim 10, wherein the step of using the tester includes overstressing or applying prolonged or cyclical test under various conditions to at least one memory cell in the 3D memory structure.

13. A method for testing a vertical memory structure disposed on a semiconductor substrate, the method comprising:
    creating, from a wafer containing a plurality of 3D memory devices, at least one direct connect 3D memory device;
    wherein the at least one direct connect 3D memory device has no peripheral circuitry interconnects, disposed over a 3D memory structure comprising strings of memory cells arranged in an array and coupled between word lines and bit lines;
    wherein the step of creating includes providing a test interconnect structure including test pads over the 3D memory structure of the at least one direct connect 3D memory device that allows direct electrical connections to the word lines and the bit lines associated therewith;
    directly connecting a direct tester to predetermined ones of the test pads of the at least one direct connect 3D memory device; and
    using the direct tester, applying a predetermined voltage to the at least one direct connect 3D memory device to test the electrical continuity among the word lines and the bit lines of the at least one direct connect 3D memory device.

14. The method according to claim 13, wherein the electrical integrity is one of an open, a short and a leakage of at least one memory cell in the 3D memory structure.

15. The method according to claim 14, wherein the direct tester is used to further test resistance and capacitance of at least one memory cell in the 3D memory structure.

16. The method according to claim 15, wherein the direct tester is further used to test threshold voltage and conductance of at least one memory cell in the 3D memory structure.

17. The method of claim 16, wherein the direct tester tests multiple ones of the memory cells in the 3D memory structure in parallel.

18. The method of claim 17, wherein at least 128 memory cells are tested in parallel.

19. The method of claim 13, wherein the direct tester tests multiple ones of the memory cells in the 3D memory structure in parallel.

20. The method of claim 19, wherein at least 128 memory cells are tested in parallel.

* * * * *